Figure 1:
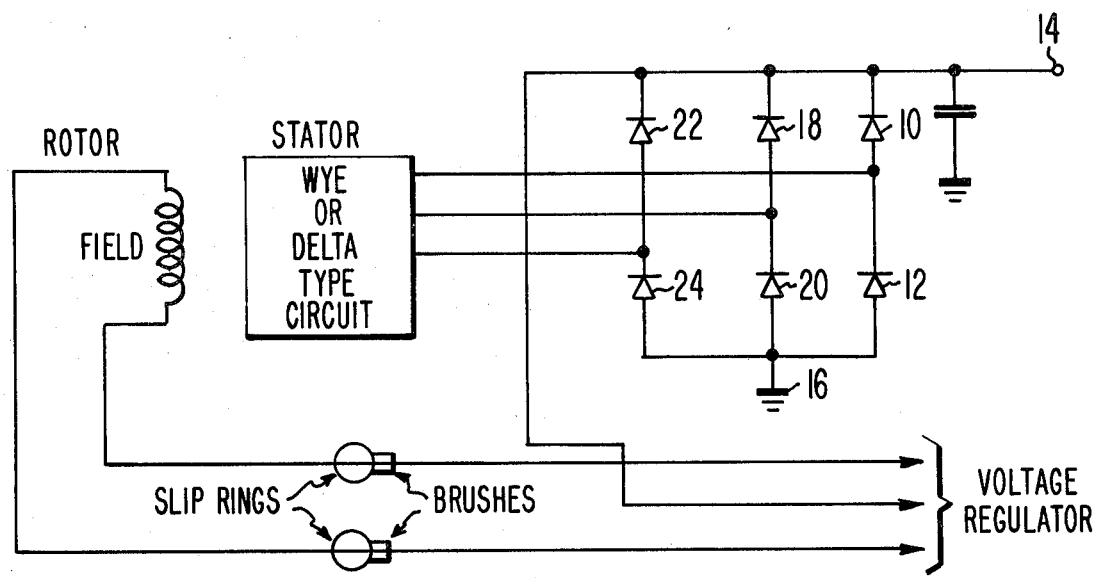

United States Patent [19]

Hulls et al.

[11] 4,178,546

[45] Dec. 11, 1979

[54] ALTERNATOR TEST APPARATUS AND METHOD

[75] Inventors: Leonard R. Hulls, Marblehead; Toy Dowdell, Jr., Acton, both of Mass.

[73] Assignee: RCA Corporation, New York, N.Y.

[21] Appl. No.: 867,510

[22] Filed: Jan. 6, 1978

[51] Int. Cl.[2] .................. G01R 31/00; G08B 21/00
[52] U.S. Cl. ........................... 324/158 MG; 322/99
[58] Field of Search ........... 324/158 MG, 158 D, 119; 340/645; 73/115; 322/99

[56] References Cited

U.S. PATENT DOCUMENTS

| | | | |
|---|---|---|---|
| 2,123,859 | 7/1938 | Winograd | 340/645 |
| 3,629,704 | 12/1971 | Stevens | 324/158 MG |
| 3,977,239 | 8/1976 | Hulls et al. | 73/115 |
| 3,978,416 | 8/1976 | Sutphin et al. | 328/167 |
| 3,978,719 | 9/1976 | Hadden et al. | 73/115 |

Primary Examiner—Rudolph V. Rolinec
Assistant Examiner—Ernest F. Karlsen
Attorney, Agent, or Firm—Samuel Cohen; William Squire

[57] ABSTRACT

An automobile alternator test apparatus tests for the presence of a failed diode by detecting a frequency component (a subharmonic component) in the alternator output ripple voltage produced by the failed diode. The subharmonic frequency component is detected by a tracking filter that is slaved to the subharmonic frequency of the ripple frequency voltage produced by the failed diode. The output signal of the slaved filter indicates the presence of the failed diode.

7 Claims, 4 Drawing Figures

ALTERNATOR TEST APPARATUS AND METHOD

The present invention relates to testing and particularly to the testing of diodes in an alternator, such as one of the automotive type.

Alternators, such as those of the automotive type, include a rectifier circuit for translating the alternating voltage which is generated to a direct voltage. The rectifier circuit includes diodes and if one or more of them should become defective, the ripple component of the alternator output voltage is affected. It is known that this ripple voltage can be sensed to determine whether one of the diodes has failed. For example, U.S. Pat. No. 3,629,704 describes an alternator test apparatus which tests levels of the ripple voltage produced by the alternator to determine whether one or more of the diodes have become defective. However, such a system is also sensitive to changes in ripple voltage amplitude due to effects other than failed diodes such as the condition of the battery being charged by the alternator. Thus, testing based on amplitude alone may result in an incorrect diagnosis.

Automatic detection of abnormalities in the ripple voltage produced by an alternator is complicated by the fact that the ripple voltage frequency is proportional to engine speed. It is desirable that the automatic tester be insensitive to this parameter.

Of further interest in this area are U.S. Pat. Nos. 3,978,719; 3,977,239 and 3,978,416 and U.S. application Ser. No. 854,834, filed Nov. 25, 1977, now U.S. Pat. No. 4,143,205 entitled, "Identification of Engine Cylinder Having Fault" by Leonard Robin Hulls and Steven Clow Hadden all assigned to the assignee of the present application.

In a system embodying the invention, the presence of a faulty diode in an alternator is detected by measuring the amplitude of a subharmonic of the ripple component of the alternator output voltage. In a preferred form of the invention, frequency tracking filter means are employed for sensing frequency components of this output voltage so that the measurement can be made over a wide range of alternator speeds.

IN THE DRAWING

Figure 2:
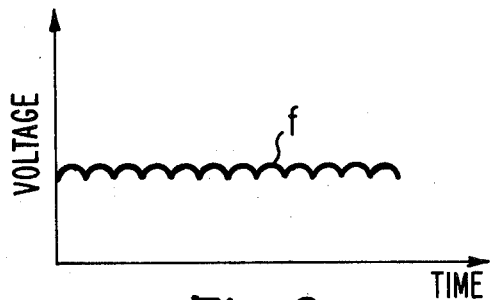
Figure 3:
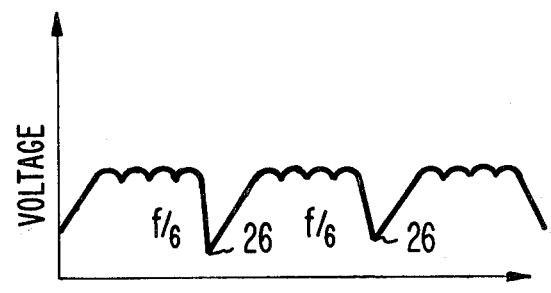
Figure 4:
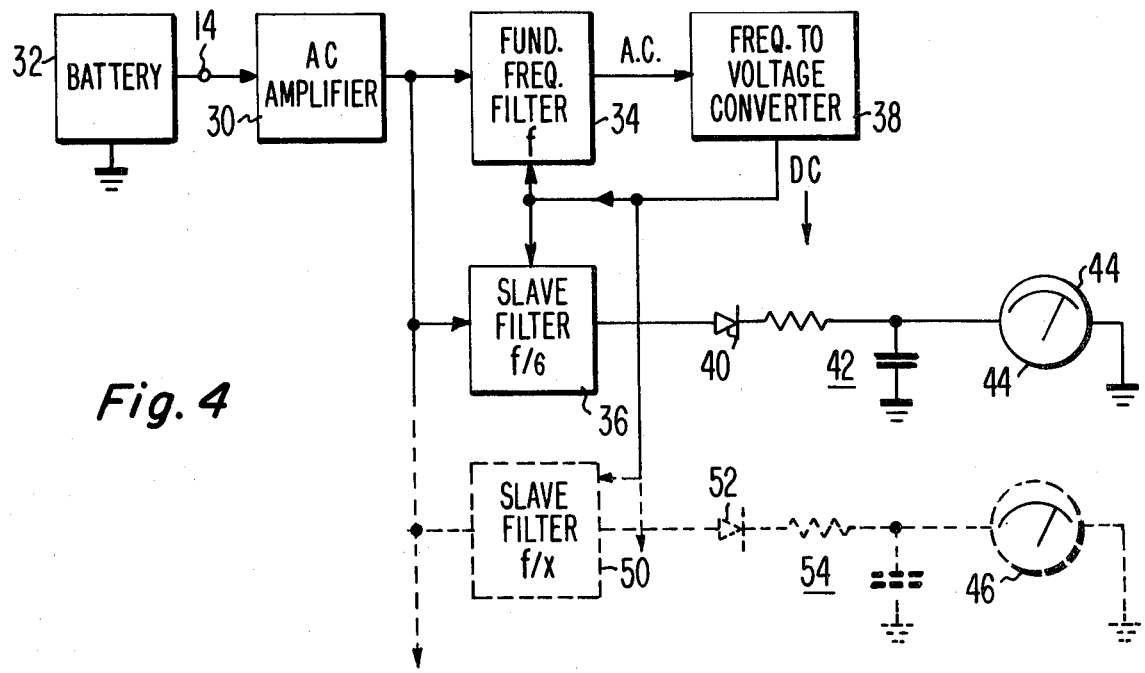

FIG. 1 is a block and schematic circuit diagram of a conventional automotive alternator, FIG. 2 is a graph of the voltage output of the alternator circuit of FIG. 1 during normal operation, FIG. 3 is a graph of the voltage output of the alternator of FIG. 1 when one of the diodes therein is failed, and FIG. 4 is a block and schematic circuit diagram of an automatic tester embodying the present invention, for testing the alternator circuit of FIG. 1 for a failed diode.

The alternator shown in FIG. 1 comprises a wye or Delta circuit in the stator coupled to the field winding of the rotor. The field winding is excited by an automotive voltage regulator through suitable slip rings and brushes. The rectifier circuit of the alternator comprises a bridge rectifier with three sets of series connected diodes, 10, 12; 18, 20; and 22, 24, each diode being a different arm of the bridge. The sets are connected, in parallel, between output terminal 14 and system ground 16 and the diodes are all poled in the same direction. The three stator windings are respectively connected to the three anode-to-cathode connection points of the three sets of diodes.

If one of the diodes becomes open circuited, a negative voltage dip is produced in the alternator ripple voltage as shown at 26 in FIG. 3. Assuming that the normal ripple voltage of a good alternator is f, as shown in FIG. 2, then the failed diode voltage dip 26 occurs at a subharmonic frequency f/6, that is at one sixth of the fundamental frequency f. Additional diode failures will further alter the frequency spectrum of the ripple. However, the relationship between the location and number of diode failures, and the frequency spectrum is complex. In general, the frequency spectrum will provide a "signature" for the failure condition and be indicative of the ones of the diodes which have failed.

The rectified output appearing at terminal 14 has a ripple frequency of six times the alternator pole passing frequency. If all the diodes are operating normally and the alternator windings are free from open or short circuits, then the ripple at frequency f is uniform as shown in FIG. 2. However, when a diode fails, i.e., opens, voltage dips are introduced into the rectified output voltage at a subharmonic of f. With one or more open circuited diodes in the rectifier array, the dips occur at a frequency f/6 and the rectified output voltage with this large subharmonic component is as shown in FIG. 3. If the frequency f is 1080 Hz, for example, f/6 will be 180 Hz. If a diode short circuits then it may cause an alternator winding to "burn out". It may, in the alternative, be "burned out" by excessive currents so that it too becomes open.

In the former event the alternator becomes inoperative. In the latter event, the output waveform produced is that of FIG. 3 and the testing procedure described detects the open diode. Any rapid change in the DC excitation to the alternator circuit of FIG. 1, which may recur sporadically results in a pulse being induced in the AC winding of the alternator. Such pulses (or spikes) and subharmonics thereof appear in the output. An important aspect of the present invention is the ability of the system to distinguish these "normal" subharmonics due to sporadic switching of the voltage regulator, from subharmonics generated by a faulty diode.

A circuit for accomplishing the above is shown in FIG. 4. It includes an alternating current (AC) amplifier 30 connected to a terminal of an automobile batter 32. The output of the AC amplifier 30 is applied to fundamental frequency tracking filter 34 and tracking slave filter 36. The output of filter 34 is applied to frequency to voltage converter 38 whose DC output voltage represents the magnitude of the input signal frequency. The DC voltage output of converter 38 is applied to filters 34 and 36. Filters 34 and 36 and converter 38 may be constructed as described in the aforementioned U.S. Pat. No. 3,978,416. Generally, these filters each include a signal input terminal, a signal output terminal and a frequency control terminal to which a control voltage is applied to control the frequency pass band of that filter. If the frequency of the input signal increases, the control voltage produced by converter 38 increases also and causes the pass band frequency of that filter to increase a corresponding amount without delay.

The filter 34 is tuned to respond to the fundamental frequency f of the alternator output voltage, FIG. 2. As engine speed changes, the alternator speed changes and the ripple frequency f changes correspondingly. DC feedback from converter 38, however, causes the passband of the filter 34 to track the ripple frequency. Filter 34 produces an AC signal that is applied to converter 38. This AC signal has a frequency corresponding to a fundamental frequency f of the ripple in the alternator output. The converter 38, responsive to the AC input signal, generates the DC voltage whose DC level is proportional to the frequency of the AC input signal. This DC voltage is applied to both the fundamental frequency filter 34, as already discussed, and the slave filter 36 to alter the frequency response of these filters in accordance with the level of the DC voltage. Thus, as the fundamental filter 34 de-tunes from the ripple frequency, its AC output signal changes in magnitude in the same direction resulting in a DC output voltage from converter 38 which also changes accordingly and which re-tunes the filter 34 in the direction to maximize the response to the signal produced by the alternator. Reference is made to the aforementioned U.S. Pat. No. 3,978,416 for further details on the construction and operation of the tracking filters.

The slave filter 36 is tuned to a particular subharmonic frequency, for example f/6. When this particular frequency component is present, the slave filter produces an output signal which is applied through diode 40, and time delay filter 42, to moving coil voltmeter 44, the latter being connected at its other terminal to system ground.

The purpose of the time delay filter 42 is to provide integration of the subharmonic signal. This enhances the indication of the diode fault detected in the ripple signal while minimizing sensitivity to subharmonics generated by sporadic switching of the voltage regulator. In this way it is possible to obtain a rapid and reliable indication of the presence of a failed alternator diode.

The system as described so far detects any diode failure. There may be some value, in special situations, in knowing whether more than one diode has failed in these cases additional slave filters such as 50 (shown in phantom) can be connected in parallel with filter 36, each responsive to a different "signature" voltage dip at a particular frequency which may be a subharmonic frequency f/x, f/y, etc. The output of a filter such as 50 is applied through a corresponding rectifying diode 52, and time delay RC network 54 to a moving coil voltmeter 46. The filter 50 is controlled by converter 38 in the same way as the converter controls filter 36.

In the alternative, the output of the slave filters such as 36, 50 and so forth may be connected to a computer system for automatically providing a failed diode fault condition. In any case, the present system is insensitive to amplitude variations and, therefore, provides a more reliable test.

The apparatus of the present invention uses tracking filter techniques compatible with those described in the commonly assigned patents noted in the introductory portion. As a result, alternator diode testing as disclosed in this application can be readily adopted to be used with overall engine diagnostic equipment incorporating systems such as described in those patents. Thus, a variety of test parameters can be tested by a single integrated system.

What is claimed is:

1. A method for testing a variable speed alternator having output winding means, and rectifier means connected to said output winding means for rectifying the alternating voltage produced at said winding means to obtain a direct current output having a variable ripple frequency component at a variable frequency f, said rectifier means including a plurality of diodes, for the failure of one of said diodes, comprising the step of:
    tracking the frequency of and measuring the amplitude of a particular subharmonic of said variable frequency f, said amplitude, when it exceeds a given value, being indicative of a failed diode.

2. Apparatus for testing a variable speed alternator of the type including output winding means, and rectifier means connected to said winding means for rectifying the alternating voltage produced by said winding means to obtain a DC voltage having a variable ripple component at a variable frequency f, the rectifier means including a plurality N of diodes, said apparatus comprising:
    means for tracking the frequency of and sensing the amplitude of the component of said DC output voltage at a particular subharmonic of said variable frequency f.

3. Apparatus as set forth in claim 2 wherein said rectifier means comprises a bridge rectifier having N arms, each arm comprising a diode, and wherein said subharmonic of f comprises f/N.

4. Apparatus as set forth in claim 2, wherein said means for sensing comprises:
    a tunable first filter tuned to frequency f receptive of said output voltage;
    a tunable second filter tuned to said subharmonic of f receptive of said output voltage; and
    means responsive to the output of said first filter for controlling the frequencies to which said first and second filters are tuned for causing said first filter to track said frequency f over a range of f and for concurrently causing said second filter to track said subharmonic of f.

5. Apparatus as set forth in claim 4, further including means for measuring and indicating the amplitude of said subharmonic of f.

6. Apparatus as set forth in claim 5, wherein said means for measuring and indicating comprises:
    means for rectifying the output of said second filter;
    integrator means for integrating the rectified output of said second filter; and
    means for indicating the amplitude of the output of said integrator means.

7. Apparatus for testing an alternator of the type including output winding means, and rectifier means connected to said winding means for rectifying the alternating voltage produced by said winding means to obtain a DC voltage having a ripple component at frequency f, the rectifier means including a plurality N of diodes, said apparatus comprising:
    means for sensing the amplitude of the component of said DC output voltage at a particular subharmonic of f comprising:
    a tunable first filter tuned to frequency f receptive of said output voltage;
    a tunable second filter tuned to said subharmonic of f receptive of said output voltage; and
    means responsive to the output of said first filter for controlling the frequencies to which said first and second filters are tuned for causing said first filter to track said frequency f over a range of f and for concurrently causing said second filter to track said subharmonic of f.

* * * * *